United States Patent [19]

Swapp

[11] Patent Number: 4,858,208
[45] Date of Patent: Aug. 15, 1989

[54] APPARATUS AND METHOD FOR TESTING SEMICONDUCTOR DEVICES

[75] Inventor: Mavin C. Swapp, Mesa, Ariz.

[73] Assignee: Motorola, Inc., Schaumburg, Ill.

[21] Appl. No.: 217,250

[22] Filed: Jul. 11, 1988

[51] Int. Cl.$^4$ .......................... G04F 8/00; G01R 25/00
[52] U.S. Cl. ..................................... 368/118; 368/120; 324/83 R
[58] Field of Search ............................... 368/113–120; 324/73 R, 73 AJ, 82, 83 R; 377/20, 21, 24; 364/569

[56]     References Cited
U.S. PATENT DOCUMENTS

| | | | |
|---|---|---|---|
| 3,676,777 | 7/1972 | Charters | 324/73 |
| 3,866,126 | 6/1975 | Cebula et al. | 368/118 |
| 3,944,938 | 3/1976 | Brouant | 329/50 |
| 3,969,618 | 7/1976 | Strubel et al. | 235/153 |
| 3,984,770 | 10/1976 | Chu | 324/82 |
| 4,118,665 | 10/1978 | Reinhardt | 324/57 |
| 4,119,910 | 10/1978 | Hayashi | 324/83 |
| 4,287,594 | 9/1981 | Shirasaka | 371/25 |
| 4,293,950 | 10/1981 | Shimizu et al. | 371/21 |
| 4,338,569 | 7/1982 | Petrich | 328/155 |
| 4,348,743 | 9/1982 | Dozier | 368/107 |
| 4,348,759 | 9/1982 | Schnurmann | 371/20 |
| 4,365,334 | 12/1982 | Smith et al. | 371/27 |
| 4,439,858 | 3/1984 | Peterson | 371/20 |
| 4,450,560 | 5/1984 | Connor | 371/25 |
| 4,493,079 | 1/1985 | Hughes et al. | 371/27 |
| 4,517,661 | 5/1985 | Graf et al. | 362/900 |
| 4,604,744 | 8/1986 | Littlebury et al. | 371/20 |
| 4,681,449 | 7/1987 | Bloom et al. | 356/364 |
| 4,694,242 | 9/1987 | Peterson et al. | 324/73 |
| 4,720,670 | 1/1988 | Boyle | 324/73 |
| 4,736,351 | 4/1988 | Oliver | 368/118 |

FOREIGN PATENT DOCUMENTS 61-51590  3/1986  Japan .

Primary Examiner—Vit W. Miska
Attorney, Agent, or Firm—Joe E. Barbee

[57]     ABSTRACT

A signal of a known period is transmitted through a semiconductor device to the set input of a flip-flop. The reset input of the flip-flop receives the original signal delayed by one-half the known period. The inverted and noninverted outputs of the flip-flop are then filtered and input to a leveling circuit and a differential amplifier. The leveling circuit adjusts the outputs of the flip-flop to produce signals of constant known amplitude. The output of the differential amplifier represents the delay of the signal through the semiconductor device.

20 Claims, 3 Drawing Sheets

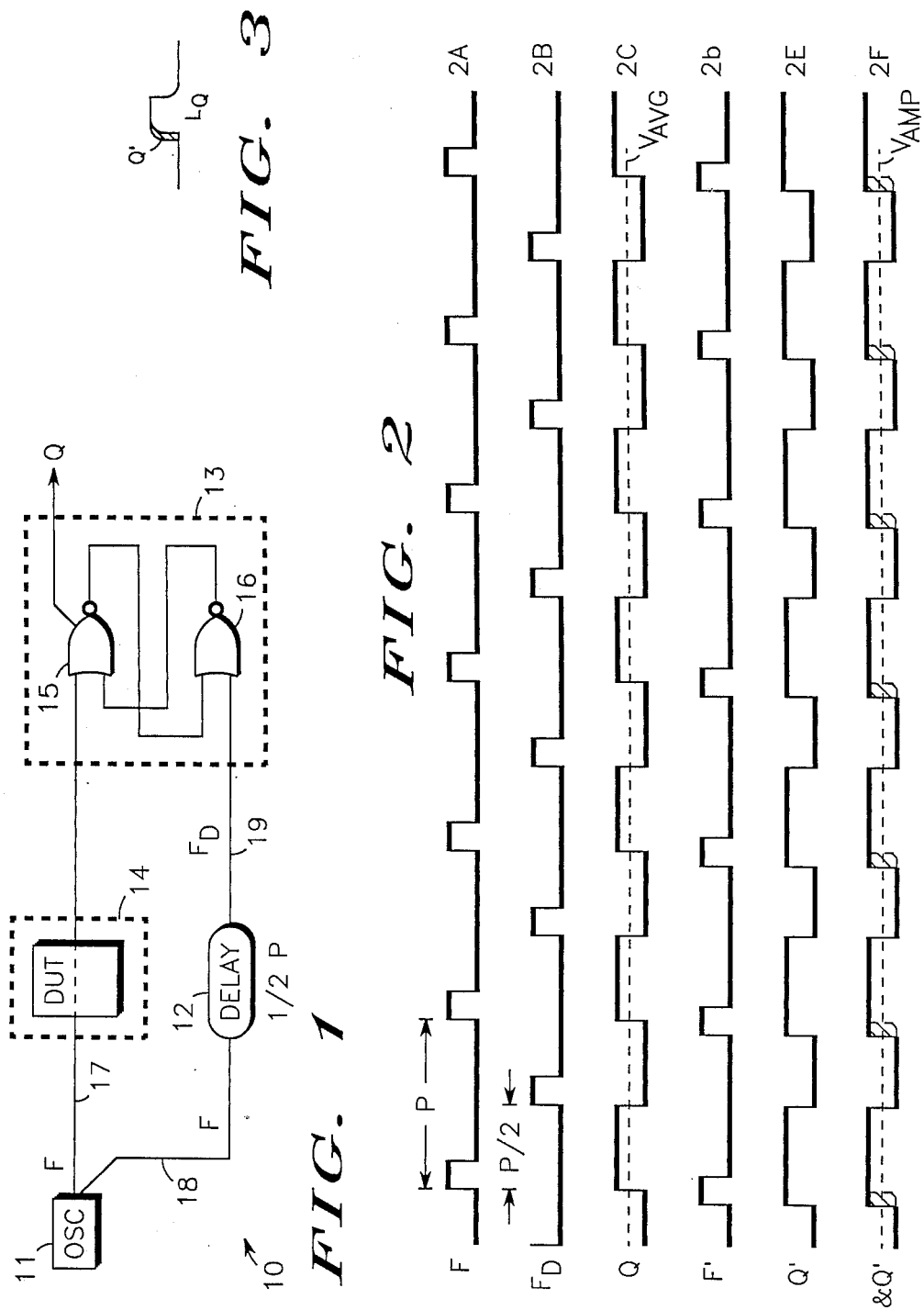

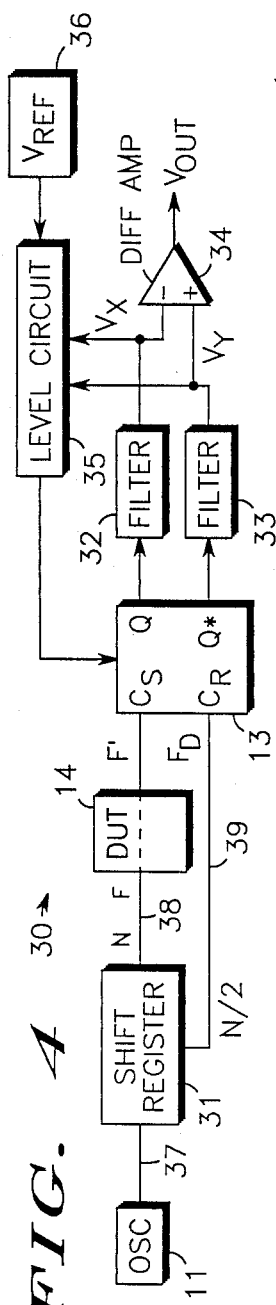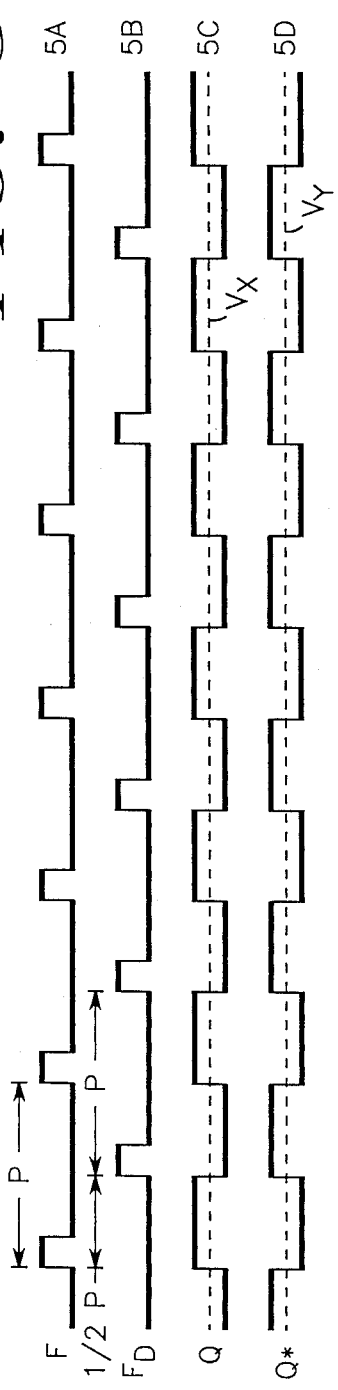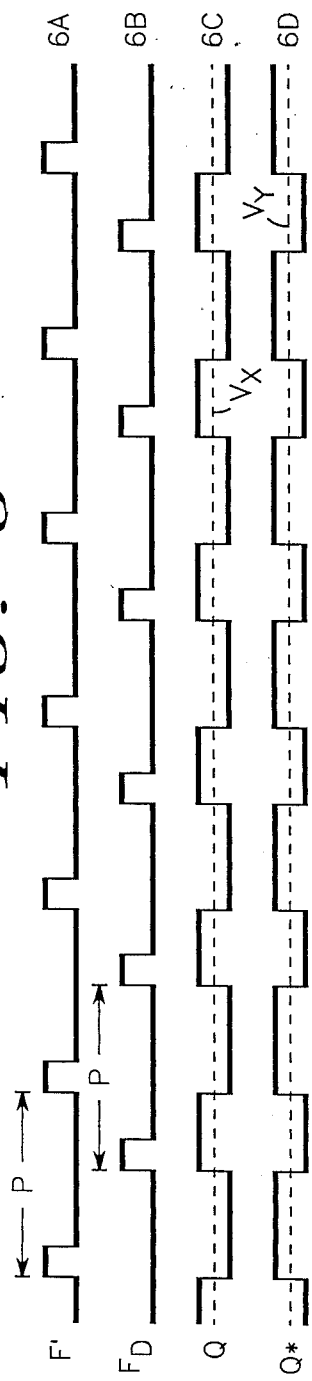

4,858,208

APPARATUS AND METHOD FOR TESTING SEMICONDUCTOR DEVICES

BACKGROUND OF THE INVENTION

The present invention relates, in general, to testing semiconductor devices and, more particularly to measuring variations in propagation times, or delays, through semiconductor devices with the use of ratiometric time measurements.

A crucial step in the manufacture of semiconductor devices is the testing of those circuits. A continuing problem in the area of testing semiconductor devices is that as the circuits in the semiconductor devices become faster, testers employing older slower devices cannot operate fast enough to perform the tests. This problem is severely compounded when the measurement being taken is that of the variances in propagation times among a production lot of semiconductor devices.

Accordingly, it is an object of the present invention to provide an apparatus and method for testing semiconductor devices which overcomes the above deficiencies.

A further object of the present invention is to provide an apparatus and method for testing semiconductor devices which is capable of measuring picosecond, or less, differences in propagation delays of semiconductor devices.

Another object of the present invention is to provide an apparatus and method for testing semiconductor devices which is accurate.

Still another object of the present invention is to provide an apparatus and method for testing semiconductor devices which does not require full scale calibration.

SUMMARY OF THE INVENTION

A particular embodiment of the present invention comprises a method for testing a delay of a signal transmitted through a semiconductor device wherein a signal of a known period is transmitted through the semiconductor device. The delayed signal from the semiconductor device is then transmitted to a set input of a flip-flop. A second signal having the same known period and delayed by a time equal to one-half the period is transmitted to the reset input of the flip-flop. The outputs, inverted and noninverted, of the flip-flop are then transmitted through a filter to produce a pair of analog signals. These signals are transmitted into a level circuit which acts to adjust the range of the output of the flip-flop. The analog signals are also transmitted to a differential amplifier where they are compared. If the analog signals are equal, a zero output is produced from the differential amplifier. If the analog signals are unequal, a nonzero output is produced from the differential amplifier. This nonzero output is indicative of the delay caused by the semiconductor device. The differences in delays of other semiconductor devices can be determined by taking the difference of the output for one device and comparing it to the output of a second device.

In a particular embodiment of the present invention, an apparatus is provided for measuring delays through semiconductor devices. The apparatus comprises a signal generator which provides signals of a known period. The outputs of the signal generator are coupled to a flip-flop with one of the signals passing through a device under test. The outputs of the flip-flop are coupled to a filter to produce analog signals. The output of the filters are coupled to a level circuit which has an output coupled to the flip-flop for adjusting the flip-flop's output range. The outputs of the filters are also coupled to a differential amplifier. The output of the differential amplifier is used to calculate the delay caused by the device under test.

BRIEF DESCRIPTION OF THE DRAWINGS

FIG. 1 is a block diagram of a circuit illustrating the basic concept of the present invention;

FIG. 2 is a timing diagram of the circuit of FIG. 1;

FIG. 3 is a timing pulse for a true circuit;

FIG. 4 is a block diagram of a circuit embodying the present invention;

FIG. 5 is a timing diagram of the circuit of FIG. 4;

FIG. 6 is a timing diagram of the circuit of FIG. 4 including the device under test.

DETAILED DESCRIPTION OF THE DRAWINGS

Figure 7:
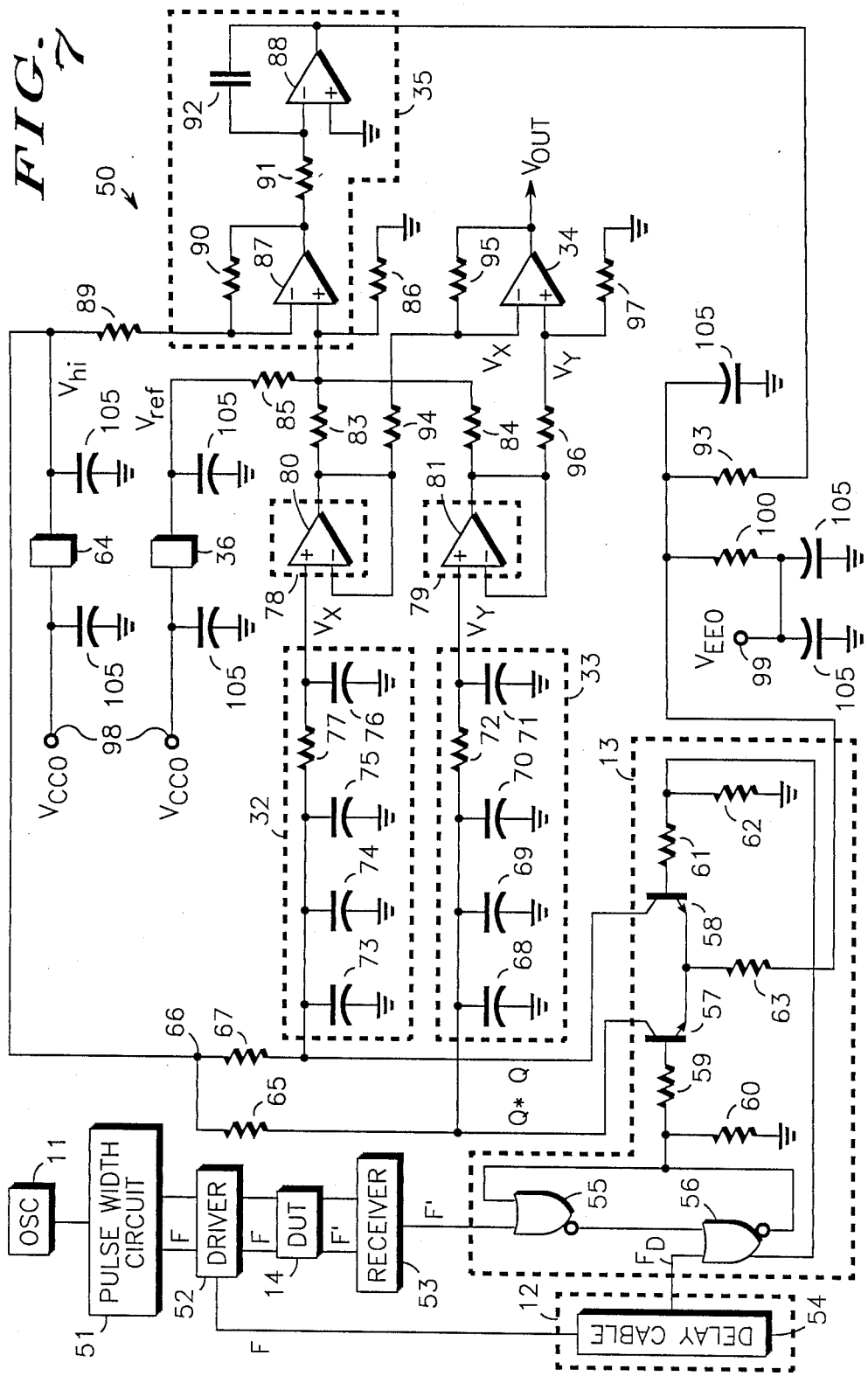
FIG. 7 is a schematic diagram of a circuit embodying the present invention.

Referring initially to FIGS. 1 and 2, a block diagram of a circuit, generally designated 10, illustrating the basic concept of the present invention and a timing diagram for circuit 10 are illustrated. Circuit 10 consists essentially of an oscillator 11, a delay 12, a flip-flop 13, and a device under test (DUT) 14. Flip-flop 13 is comprised of a pair of interconnected NOR gates 15 and 16.

In operation, oscillator 11 provides an output signal, F, illustrated by timing line 2A, FIG. 2. This signal has a period P. The signal is transmitted through two lines 17 and 18 Line 17 couples oscillator 11 to one input of flip-flop 13. Line 18 couples oscillator 11 to delay 12. Delay 12 represents the delay in a coaxial cable and is ½ the period, P, of signal, F. The output signal from delay 12 is designated $F_D$ and is illustrated in line 2B, FIG. 2. Signal $F_D$ is then transmitted along a line 19 to the second input of flip-flop 13. The voltage output Q of flip-flop 13 is illustrated by line 2C, FIG. 2. The average output voltage of this signal is designated by dashed line $V_{AVG}$. Signal F from oscillator 11 acts to set flip-flop 13 while signal FD from delay 12 acts to reset flip-flop 13.

The next step is to determine the difference in propagation delay between DUT 14 and delay 12. DUT 14 is inserted into line 17 between oscillator 11 and flip-flop 13. This causes a delay to be generated in the input to flip-flop 13. This delayed signal F' is illustrated in line 2D, FIG. 2. This changes the voltage output of flip-flop 13 to Q', line 2E, FIG. 2. The average output voltage of this signal is designated by dashed line $V_{AMP}$. By transposing signals Q and Q' on top of one another, the signal represented on line 2F, FIG. 2, is formed. The area added to the signal by delaying signal Q, forming Q', is illustrated by the cross hatched portion of line 2F.

The output of circuit 10 is representative of a delay $T_x$, or difference in the delay between the DUT path and the delay path. The ratio of the propagation times to the output voltages is set forth in equation (1) below.

$$T_x/P = V_{AVE}/V_{AMP}. \qquad (1)$$

Defining $T_{x1}$ as the difference in path delays without DUT 14 present and $T_{x2}$ as the difference in path delays with DUT 14 present, then the delay through DUT 14, $T_D$, is defined as:

$$T_D = T_{x1} - T_{x2} \tag{2}$$

or, $$T_D = \frac{(P)(V_{AVE(no\ DUT)})}{V_{AMP}} - \frac{(P)(V_{AVE(DUT)})}{V_{AMP}} \tag{3}$$

which reduces to:

$$T_D = \frac{P}{V_{AMP}} (V_{AVE(no\ DUT)} - V_{AVE(DUT)}). \tag{4}$$

As can be appreciated by those skilled in the art, the signal pulses illustrated in FIG. 2 are generally not a perfect square wave. Instead, the pulses are more the shape shown in FIG. 3. However, the difference between Q and Q' represented by the hatched area is closely approximated by the linear model utilized in FIG. 2 and provides no appreciable error at the picosecond times being measured.

Referring now to the block diagram of FIG. 4, a circuit, generally designated 30, embodying the present invention is illustrated. As in circuit 10 of FIG. 1, circuit 30 contains: oscillator 11, flip-flop 13, and DUT 14. In addition, circuit 30 contains an N-bit shift register 31, a pair of filters 32 and 33, a differential amplifier 34, a level circuit 35, and a voltage reference 36.

In operation, oscillator 11 generates a signal having an N×F frequency, where N is the same as the number of bits in an N-bit shift register 31. This signal is transmitted to shift register 31 along a line 37. Shift register 31 produces an output signal having one output pulse for every N input pulses. One signal produced is signal F, line 5A, FIG. 5, which is output on a line 38. Shift register 31 is also taped to produce a second output signal $F_D$. As shown in FIG. 5, line 5B, signal $F_D$ has the same period as signal F, but is delayed half a period. Signal $F_D$ is transmitted along line 39 to the reset input of flip-flop 13.

Signal F is transmitted to DUT 14 where the signal is subjected to some propagation delay $T_x$. The output of DUT 14 is signal F' which is output along line 40 to the set input of flip-flop 13.

If DUT 14 is removed from the circuit and signal F is transmitted to the set input of flip-flop 13, the output signal Q, line 5C, will be generated. The inverse of signal Q, Q*, line 5D, will also be output from flip-flop 13. Because FD is delayed by one-half the propagation time P, a uniform signal Q is generated where the duration of the pulses is the same as the duration of the time between pulses. Signals Q and Q* toggle between 0 V and 5 V and are transmitted to filters 32 and 33, respectively, where uniform signals $V_x$ and $V_y$ are generated. Signals $V_x$ and $V_y$ are represented on lines 5C and 5D respectively.

With the outputs of flip-flop 13 toggling between 0 V and 5 V and the pulses being evenly spaced, outputs from filters 32 and 33 will both be 2.5 V. These outputs are then input to differential amplifier 34 where an output $V_{out}$ is produced. With both inputs being equal, $V_{out}$ will be zero.

Voltage reference 36 and level circuit 35 are provided to adjust the output range of flip-flop 13. If the sum of the $V_x$ and $V_y$ signals is not 5 V, this will be sensed by level circuit 35 which will adjust the output of flip-flop 13 to produce a summed 5 V output. Reference 36 is coupled to level circuit 35 to provide an accurate $V_{ref}$ signal to compare with the $V_x$ and $V_y$ inputs. The level equation is defined by:

$$V_x + V_y = V_{amp} = KV_{ref} \tag{5}$$

where:
  $V_x$ and $V_y$ are voltages input to amplifier 34; and
  $KV_{ref}$ is the voltage reference signal from reference 36 times a constant K.

When DUT 14 is inserted into circuit 30, signal F is delayed, generating signal F', line 6A, FIG. 6. This causes signal Q of flip-flop 13 to have pulses of shorter duration, line 6C, and, conversely, signal Q* has pulses of longer duration. The result of this is that signal $V_x$ decreases while signal $V_y$ increases. This causes a $V_{out}$ other than zero to be output from amplifier 34. The delay, $T_D$, caused by DUT 14 is defined by:

$$T_D = (V_{out})(P)/(Gain)(V_{amp}) \tag{6}$$

where:
  $V_{out}$ is $V_y - V_x$
  P is the period of the signal;
  Gain is the gain of differential amplifier 34; and
  $V_{amp} = V_x + V_y$.

Therefore, since all of the above variables are known, with the exception of $T_D$, $T_D$ can be determined.

Through the substitution of shift register 31 into circuit 30, the coaxial delay line represented by delay 12 can be eliminated. The advantages of this can be shown mathematically by substituting the following into equation (1) with respect to circuit 10:

$$V_{AVE} = V_x \tag{7}$$

$$T_x = T_{coax} - T_{DUT}, \text{ and} \tag{8}$$

$$V_{OUT} = k(V_y - V_x) \tag{9}$$

where $V_y + V_x = V_{AMP}$. By substituting and reducing, equation (1) becomes:

$$T_{DUT} = \frac{(P)(V_{OUT})}{2kV_{AMP}} - \frac{(P)}{2} + T_{coax} \tag{10}$$

When shift register 31 is used in circuit 30, $T_{coax}$ can be set at $\frac{1}{2}P$ by tapping at n/2. Substituting this into equation (10) causes the $T_{coax}$ and $-P/2$ terms of equation (10) to cancel each other out leaving:

$$T_{DUT} = (V_{OUT})(P)/2kV_{AMP} \tag{11}$$

If $T_{DUT}$ should be greater than the range circuit 30 is set to measure, the tap into shift register 31 can be moved to effectively reduce the delay measured. The resulting output is then adjusted.

Referring now to FIG. 7, a schematic diagram of a circuit, generally designated 50, embodying the present invention is illustrated. Circuit 50 comprises an oscillator 11, delay 12, flip-flop 13, device under test 14, filters 32 and 33, differential amplifier 34, level circuit 35, and voltage reference 36. In operation, oscillator 11 transmits a signal to a pulse width circuit 51. Pulse width circuit 51 provides signal F to a driver means 52. The output of driver 52 is transmitted to DUT 14 and delay 12. Signal F is transmitted through DUT 14 producing an output signal F'. Signal F' is then transmitted to a receiver means 53.

In this particular embodiment, driver 52, DUT 14, and receiver 53 are the same device. This ensures that the signal being transmitted to DUT 14 from driver 52 is one that DUT 14 can accept. In addition, if receiver 53 is the same type device as DUT 14, this ensures that the signal produced by DUT 14 can be accepted.

Signal F is also transmitted from driver 52 to delay 12 which consists of a delay cable 54. This produces the output signal FD. Signals F' and $F_D$ are then input into flip-flop 13.

Flip-flop 13 consists of a pair of dual input gates 55 and 56. Gate 56 has a pair of outputs which are coupled to a pair of transistors 57 and 58. A NOR output from gate 56 is coupled to transistor 57; and, an OR output from gate 56 is coupled to transistor 58. The NOR output from gate 56 is coupled to the base of transistor 57 through a pair of biasing resistors 59 and 60. The OR output from gate 56 is coupled to the base of transistor 58 through a pair of biasing resistors 61 and 62. In this particular embodiment, resistors 59, 60, 61, and 62 are each 50 ohms.

The emitters of transistors 57 and 58 are coupled to a correcting input of flip-flop 13. The correcting input is then coupled to the output of level circuit 35 through resistors 63 and 93. The emitters of transistors 57 and 58 are also coupled to a $V_{EEO}$ node 99 through a coupling resistor 100. Level circuit 35 acts to change the voltage across resistor 93, which, in turn will change the current being drawn through an active transistor 57 or 58. This is used to adjust the output voltages Q and Q* so that they have an accurate 5 V range. In this particular embodiment, Q and Q* pulse between 3 V and 8 V.

The output Q of flip-flop 13 is coupled to an input of filter 33 and to an output of a voltage regulator 64 through a resistor 65. Voltage regulator 64 has an input coupled to a VCCO node 98 and provides an output voltage to a node 66 which is maintained at a constant level. In the present embodiment, the output of regulator 64 and the voltage at node 66 are a constant 8V. The Q* output of flip-flop 13 is coupled to an input of filter 32 and to node 66 through a resistor 67.

Filters 32 and 33 convert signals from digital signals Q and Q* to a constant analog type voltage signals $V_x$ and $V_y$. Filters 32 and 33 each contain: a plurality of capacitors 68–71 and 73–76, respectively, coupled between the input and ground; and a single resistor 72 and 77, respectively. It should be noted here, that there are various types of filters that may produce the same resulting signals needed. In this particular embodiment, capacitors 68 and 73 are 100 picofarads; capacitors 69 and 74 are 1000 picofarads; capacitors 70 and 75 are 0.001 microfarads; and capacitors 71 and 76 are 0.01 microfarads. Resistors 72 and 77 are 10K ohms.

The outputs from filters 32 and 33 are passed through buffers 78 and 79, respectively. Buffers 78 and 79 prevent current from being drawn through filters 32 and 33. Buffers 78 and 79 consist of operational amplifiers 80 and 81, respectively. Each operational amplifier 80 and 81 has the output from its respective filter coupled to the noninverting input. The output from amplifiers 80 and 81 are coupled back to their respective inverting inputs. Since there are no input or feedback resistors associated with amplifiers 80 and 81, they provide unitary gain to the input signals $V_x$ and $V_y$.

The outputs from amplifiers 80 and 81 are coupled to a noninverting input of an amplifier 87 through resistors 83 and 84, respectively. Voltage reference 36 has an input coupled to $V_{CCO}$ node 98 and an output coupled to the noninverting input of amplifier 87 through a resistor 85. The noninverting input of amplifier 87 is also coupled to ground through a resistor 86. Resistors 83, 84, 85, and 86 all have the same resistance (20K ohms in this embodiment). The inverted input of amplifier 87 is coupled to the output of a voltage reference ($V_{hi}$) 64 through resistor 89. The output of amplifier 87 is also coupled back into the inverted input through a resistor 90. Since the resistance of resistors 89 and 90 is the same (10K ohms in this embodiment) the gain of the inverted signal is unitary. The output voltage of amplifier 87 is defined by the equation:

$$V_x/2 + V_y/2 + V_{ref}/2 - V_{hi} = V_{out} \qquad (12)$$

In the present embodiment, without DUT 14 present, the values of Q and Q* vary between 3 V and 8 V, which will produce $V_x$ and $V_y$ values of 5.5 V each. With $V_{ref}$ set at 5 V and $V_{hi}$ at 8 V, the above equation yields a $V_{out}$ value of 0 V when $V_{amp}$ equals 5 V.

Level circuit 35 consists essentially of operational amplifier 87 and a linear comparator 88. With an output from amplifier 87 of 0 V, no correction of flip-flop 13 will be made by level circuit 35.

However, if the outputs Q and Q* are not within the proper range, an output other than 0 V will be produced at the output of amplifier 87. At this point, linear comparator 88 will correct outputs Q and Q* of flip-flop 13. The noninverted input of linear comparator 88 is coupled to ground. The inverted input of linear comparator 88 is coupled: to the output of amplifier 87 through a resistor 91; and to the output of linear comparator 88 through a capacitor 92. Resistor 91 and capacitor 92 are provided for loop stability. This arrangement causes the output of linear comparator 88 to track the inverse output of amplifier 87.

As the voltage output of linear comparator 88 changes, the current across a coupling resistor 93 will change. This causes the current through transistors 57 and 58 to vary until the output of flip-flop 13 has been corrected.

The output of buffer 78 is coupled to the inverse input of amplifier 34 through a resistor 94. The output of amplifier 34 is also coupled to the inverted input through resistor 95. In this particular embodiment, resistor 95 (100K ohms) is ten times the resistance of resistor 94 (10K ohms). This provides a gain of 10 times to the inverted input signal.

The output of buffer 79 is coupled to the noninverting input of amplifier 34 through a resistor 96. The noninverting input of amplifier 34 is also coupled to ground through a resistor 97. With a resistance (100K) of resistor 97 ten times the resistance (10K) of resistor 96, a gain of 10 times is provided to the noninverted input signal.

When a difference in delays, $T_D$, in the input signals F' and $F_D$ has occurred, a nonzero output, $V_{out}$, will be produced at the output of amplifier 34. The value of $T_D$ can then be determined according to equation (6). By inserting the values given for the various devices, it can be determined that a change of 10 mV in $V_{out}$ represents a change in 1 picosecond in delay time, $T_D$.

Various capacitors 105 are distributed throughout circuit 50. Capacitors 105 serve as an AC coupling to ground to eliminate noise in circuit 50.

To determine the variances in delays through a production lot of devices. A first device, DUT 14, is inserted in circuit 50. This produces an output voltage $V_{out}$. Following this, a second device, DUT 14, is inserted in circuit 50. The output voltage, $V_{out}$, is again measured and compared to the first voltage measured. The difference in voltages represents a one picosecond change in delay, $T_D$, for each 10 mV change in the output voltages. The devices can then be tested to verify that the delay times through the devices are consistent within a specified range.

Thus, it will be apparent to one skilled in the art that there has been provided in accordance with the invention, a device and method that fully satisfies the objects, aims, and advantages set forth above.

While the invention has been described in conjunction with specific embodiments thereof, it is evident that many alterations, modifications, and variations will be apparent to those skilled in the art in light of the foregoing description. Accordingly, it is intended to embrace all such alterations, modifications, and variations in the appended claims.

I claim:

1. A method for testing a delay of a signal transmitted through a semiconductor device comprising the steps of:
    transmitting said signal to said semiconductor device and to one of a set or reset input of a flip-flop;
    transmitting said signal through said semiconductor device creating a delayed signal;
    transmitting said delayed signal from said semiconductor device to a remaining one of said set or reset inputs of said flip-flop;
    producing a flip-flop output and an inverted flip-flop output from said flip-flop;
    transmitting said flip-flop output thru a first filter producing a first analog signal;
    transmitting said inverted flip-flop output through a second filter producing a second analog signal;
    transmitting said first and second analog signals to a level circuit;
    correcting an output amplitude of said flip-flop output and said inverted flip-flop output with a level signal from said level circuit to said flip-flop;
    transmitting said first, and second analog signals to a differential amplifier;
    comparing said first and second analog signals in said differential amplifier; and
    producing an output from said differential amplifier, said output being representative of said delay of said signal through said semiconductor device.

2. The method of claim 1 wherein said signal being transmitted to said semiconductor device is provided by transmitting a signal from an oscillator.

3. The method of claim 2 wherein said signal transmitted from said oscillator to said semiconductor device is transmitted through a pulse width circuit.

4. The method of claim 1 wherein prior to the step of transmitting said first and second analog signals to a level circuit, said first and second analog signals are transmitted through a first and a second buffers, respectively.

5. The method of claim 1 further comprising the step, following the step of transmitting said first and second analog signals to a level circuit, of comparing said first and second analog signals to a reference signal.

6. A method for testing a delay of a signal transmitted through a semiconductor device comprising the steps of:
    providing a signal from an oscillator to a pulse width circuit;
    producing a signal of a first period from said pulse width circuit;
    transmitting said signal from said pulse width circuit to a semiconductor device and to a delay means;
    transmitting a signal of an unknown delay from said semiconductor device to a first input of a flip-flop;
    transmitting a signal of known delay from said delay means to a second input of said flip-flop;
    transmitting a noninverted output from said flip-flop to a first filter;
    transmitting an inverted output from said flip-flop to a second filter;
    transmitting a first analog signal from said first filter to a first buffer;
    transmitting a second analog signal from said second filter to a second buffer;
    combining said first and second analog signals with a first reference signal forming a combined signal;
    comparing said combined signal with a second reference signal in a level circuit;
    transmitting a correcting signal from said level circuit to a correcting input of said flip-flop;
    comparing said first and second analog signals; and
    providing an output signal indicative of a delay of said signal through said semiconductor device.

7. The method of claim 6 wherein the step of transmitting said signal from said pulse width circuit to said semiconductor device and to a delay means comprises the steps of:
    transmitting said signal from said pulse width circuit to a driver means; and
    transmitting said signal from said driver means to said semiconductor device and to said delay means.

8. The method of claim 6 wherein said step of transmitting a signal of an unknown delay from said semiconductor device to a first input of a flip-flop comprises the steps of:
    transmitting said signal of an unknown delay from said semiconductor device to a receiver means; and
    transmitting said signal of an unknown delay from said receiver means to said first input of said flip-flop.

9. The method of claim 6 wherein said flip-flop comprises:
    a first NOR gate having a first input coupled to said first input of said flip-flop, a second input, and an output;
    a second NOR gate having a first input coupled to said output of said first NOR gate, a second input coupled to said second input of said flip-flop, a noninverted output coupled to said second input of said first NOR gate, and an inverted output;
    a first transistor having a base coupled to said second input of said first NOR gate and to said noninverted output of said second NOR gate, a collector coupled to an inverted output of said flip-flop, and an emitter coupled to said correcting input of said flip-flop; and
    a second transistor having a base coupled to said inverted output of said flip-flop, a collector coupled to a noninverted output of said flip-flop, and an emitter coupled to said emitter of said first transistor and to said correcting input of said flip-flop.

10. The method of claim 6 wherein said first and second buffers are differential amplifiers.

11. The method of claim 6 wherein said level circuit comprises:

a differential amplifier having an inverted input coupled to a second reference means, and a noninverted input coupled to an output of said first buffer, to an output of said second buffer, and to a first reference means, and an output; and an linear comparator having an inverted input coupled to said output of said differential amplifier through a first resistor, a noninverted input coupled to a ground, and an output coupled through a first capacitor to said inverted input of said linear comparator and to a correcting input of said flip-flop.

12. An apparatus for measuring a delay of a signal transmitted through a semiconductor device comprising:

signal means for providing a signal of known period, said signal means having a first output coupled to an input of said semiconductor device and a second output;

a flip-flop having a first input coupled to an output of said semiconductor device, a second input coupled to said second output of said signal means, a correcting input, an inverted output, and a noninverted output;

level means for providing a correcting signal to said flip-flop, said level means having a first input coupled to said inverted and noninverted outputs of said flip-flop, a second input, and an output coupled to said correcting input of said flip-flop; and a differential amplifier having a first input coupled to said noninverted output of said flip-flop, a second input coupled to said inverted output of said flip-flop, and an output.

13. The apparatus of claim 12 wherein said signal means comprises:

an oscillator having an output; and a driver having an input coupled to said output of said oscillator, a first output coupled to said input of said semiconductor device, and a second output coupled to said second input of said flip-flop.

14. The apparatus of claim 13 wherein said signal means further comprises a pulse width circuit having an input coupled to said output of said oscillator and an output coupled to said input of said driver.

15. The apparatus of claim 12 wherein said flip-flop comprises:

a first NOR gate having a first input coupled to said first input of said flip-flop, a second input, and an output;

a second NOR gate having a first input coupled to said output of said first NOR gate, a second input coupled to said second input of said flip-flop, a noninverted output coupled to said second input of said first NOR gate, and an inverted output;

a first transistor having a base coupled to said second input of said first NOR gate and to said noninverted output of said second NOR gate, a collector coupled to an inverted output of said flip-flop, and an emitter coupled to said correcting input of said flip-flop; and a second transistor having a base coupled to said inverted output of said flip-flop, a collector coupled to a noninverted output of said flip-flop, and an emitter coupled to said emitter of said first transistor and to said correcting input of said flip-flop.

16. The apparatus of claim 12 wherein said level means comprises:

a differential amplifier having an inverted input coupled to said second input of said level means, and a noninverted input coupled to said inverted and noninverted outputs of said flip-flop, and an output; and an linear comparator having an inverted input coupled to said output of said differential amplifier through a first resistor, a noninverted input coupled to a ground, and an output coupled through a first capacitor to said inverted input of said linear comparator and to a correcting input of said flip-flop.

17. The apparatus of claim 12 further comprising:

a first filter having an input coupled to said noninverted output of said flip-flop and an output coupled to said first input of said level circuit and to said first input of said differential amplifier; and a second filter having an input coupled to said inverted output of said flip-flop and an output coupled to said second input of said level circuit and to said second input of said differential amplifier.

18. The apparatus of claim 17 further comprising:

a first buffer having an input coupled to said output of said first filter and an output coupled to second input of said first buffer, to said first input of said level circuit, and to said first input of said differential amplifier; and a second buffer having an input coupled to said output of said second filter and an output coupled to said second input of said second buffer, to said second input of said level circuit, and to said second input of said differential amplifier.

19. The apparatus of claim 12 further comprising a first voltage reference means having an output coupled to said first input of said level means.

20. The apparatus of claim 12 further comprising a second voltage reference means having an output coupled to said second input of said level means, and to said inverted and noninverted outputs of said flip-flop.

* * * * *